United States Patent
Wang et al.

(10) Patent No.: US 7,214,631 B2
(45) Date of Patent: May 8, 2007

(54) METHOD OF FORMING GATE DIELECTRIC LAYER

(75) Inventors: Yu-Ren Wang, Tainan (TW); Ying-Wei Yen, Miaoli County (TW); Liyuan Cheng, Hsinchu County (TW); Kuo-Tai Huang, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 10/906,008

(22) Filed: Jan. 31, 2005

(65) Prior Publication Data

US 2006/0172554 A1    Aug. 3, 2006

(51) Int. Cl.
*H01L 21/31* (2006.01)
*H01L 21/469* (2006.01)

(52) U.S. Cl. ............... 438/787; 438/791; 257/E21.16; 257/E21.269

(58) Field of Classification Search ............... 438/787, 438/788, 791; 257/E21.16, E21.469
See application file for complete search history.

(56) References Cited

U.S. PATENT DOCUMENTS

| | | | | |
|---|---|---|---|---|
| 6,093,661 | A | * | 7/2000 | Trivedi et al. ............. 438/769 |
| 6,649,538 | B1 | * | 11/2003 | Cheng et al. ............. 438/775 |
| 6,821,833 | B1 | * | 11/2004 | Chou et al. ............. 438/199 |
| 2003/0216059 | A1 | * | 11/2003 | McFadden et al. ......... 438/795 |
| 2005/0215026 | A1 | * | 9/2005 | Ohashi et al. ............. 438/424 |

* cited by examiner

*Primary Examiner*—Caridad M. Everhart
(74) *Attorney, Agent, or Firm*—Jianq Chyun IP Office

(57) ABSTRACT

A method for forming a gate dielectric layer is described. A silicon oxide layer is formed on a semiconductor substrate. Then, a first and a second nitrogen doping processes are performed in sequence to the silicon oxide layer using plasma comprising inert gas and gaseous nitrogen to form a gate dielectric layer. The first nitrogen doping process is performed at a lower power, a lower pressure and a higher inert gas to nitrogen gas ratio than those at the second nitrogen doping process. The combination of the deeper nitrogen distribution of the first nitrogen doping process and the shallower nitrogen distribution of the second nitrogen doping process produces a flatter total nitrogen distribution profile so that leakage current from electron tunneling through the gate dielectric layer can be reduced.

9 Claims, 4 Drawing Sheets

METHOD OF FORMING GATE DIELECTRIC LAYER

BACKGROUND OF THE INVENTION

1. Field of the Invention

The present invention relates to a semiconductor device manufacturing method. More particularly, the present invention relates to a method of forming a gate dielectric layer.

2. Description of the Related Art

With the trend of more miniaturized metal-oxide-semiconductor (MOS) devices, the quality of a gate dielectric layer is highly required. For example, the leakage current must be as low as possible. When the gate dielectric layer is made of silicon oxide, most manufacturers will perform a nitrogen doping process to adjust the quality of the gate dielectric layer and minimize leakage. To prevent possible impact on the threshold voltage, the flatband voltage between the substrate and the gate and the reliability of the device, a shallow nitrogen distribution is preferred in the nitrogen doping process.

However, to minimize the leakage current of the device, a flatter nitrogen distribution curve from the surface of the gate dielectric layer to its interface with the substrate is preferred. The reason is that the shallow nitrogen distribution formed by the conventional process still causes a higher leakage current when the device is miniaturized.

The aforementioned nitrogen doping process is usually performed using nitrogen plasma. FIG. 1 is a graph showing the nitrogen distribution in a silicon oxide layer caused by a conventional nitrogen plasma treatment. Wherein the nitrogen gas flow rate is 200 sccm, a high frequency power is about 500 W and a pressure is about 80 mTorr. As indicated by the nitrogen distribution curve 100 in FIG. 1, the nitrogen dopants are mostly distributed within a shallow band of the silicon oxide layer to form a distribution peak 110.

The gate dielectric layer having a shallow nitrogen distribution can only suppress the electron tunneling effect to a limited extent. Because the nitrogen concentration in the lower part of the gate dielectric layer is rather low, more energetic electrons can still tunnel through to cause more leakage current.

SUMMARY OF THE INVENTION

Accordingly, one objective of the present invention is to provide a method of forming a gate dielectric layer capable of reducing tunneling current and solving other related problems.

To achieve these and other advantages and in accordance with the purpose of the invention, as embodied and broadly described herein, the invention provides a method of forming a gate dielectric layer. First, a silicon oxide layer is formed on a semiconductor substrate. Then, a first and a second nitrogen doping process are performed in sequence to dope the silicon oxide layer using plasma comprising an inert gas and gaseous nitrogen to form a gate dielectric layer. The first nitrogen doping process is performed at a lower power, a lower pressure and a higher inert gas to nitrogen gas ratio, as compared with the second nitrogen doping process. Furthermore, the first nitrogen doping process can be carried out before or after the second nitrogen doping process.

The present invention also provides another method of forming a gate dielectric layer. First, a silicon oxide layer is formed on a semiconductor substrate. Then, a first and a second nitrogen doping process are performed in sequence to dope the silicon oxide layer using nitrogen-containing plasma to form a gate dielectric layer. The nitrogen distribution peak of the first nitrogen doping process is at the lower part of the silicon oxide layer, while that of the second nitrogen doping process is at the upper part of the silicon oxide layer. Thus, the combined nitrogen distribution inside the silicon oxide layer is more uniform than each of the nitrogen distributions of the first and the second nitrogen doping processes.

In one embodiment of the present invention, the combination of the nitrogen dopants contributed through the first nitrogen doping process and those through the second nitrogen doping process produces a substantially flat total nitrogen distribution.

Furthermore, in order to form a nitrogen distribution peak in the lower part of the silicon oxide layer in the first nitrogen doping process and a nitrogen distribution peak in the upper part of the silicon oxide layer in the second nitrogen doping process, when the nitrogen plasma also contains inert gas, the pressure or the inert gas/nitrogen gas ratio of the nitrogen plasma can be controlled to vary the kinetic energy of nitrogen ions, while the implantation depth increases with increase of the kinetic energy. Accordingly, the first nitrogen doping process requiring deeper nitrogen implantation/higher ion energy is carried out at a lower pressure than the second nitrogen doping process or a higher inert gas/nitrogen gas ratio than the second nitrogen doping process.

In another embodiment, the nitrogen-containing plasma also contains inert gas. The method of controlling the total nitrogen distribution curve includes adjusting the power and periods of the first and the second nitrogen doping processes to control their dosages respectively. Meanwhile, the pressures and inert gas/nitrogen gas ratios of the first and the second nitrogen doping processes are adjusted to control their implantation depths respectively. When the dosages and implantation depths of the two doping processes are set properly, the combination of the first and second nitrogen doping processes will produce a substantially flat total nitrogen distribution curve.

In the present invention, a first and a second nitrogen doping processes are performed to the silicon oxide layer with adjustment in doping dosage and doping depth, so that their individual doping profiles can be combined into a flatter doping profile. Hence, the gate dielectric layer is more capable of inhibiting electron tunneling and reducing leakage.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
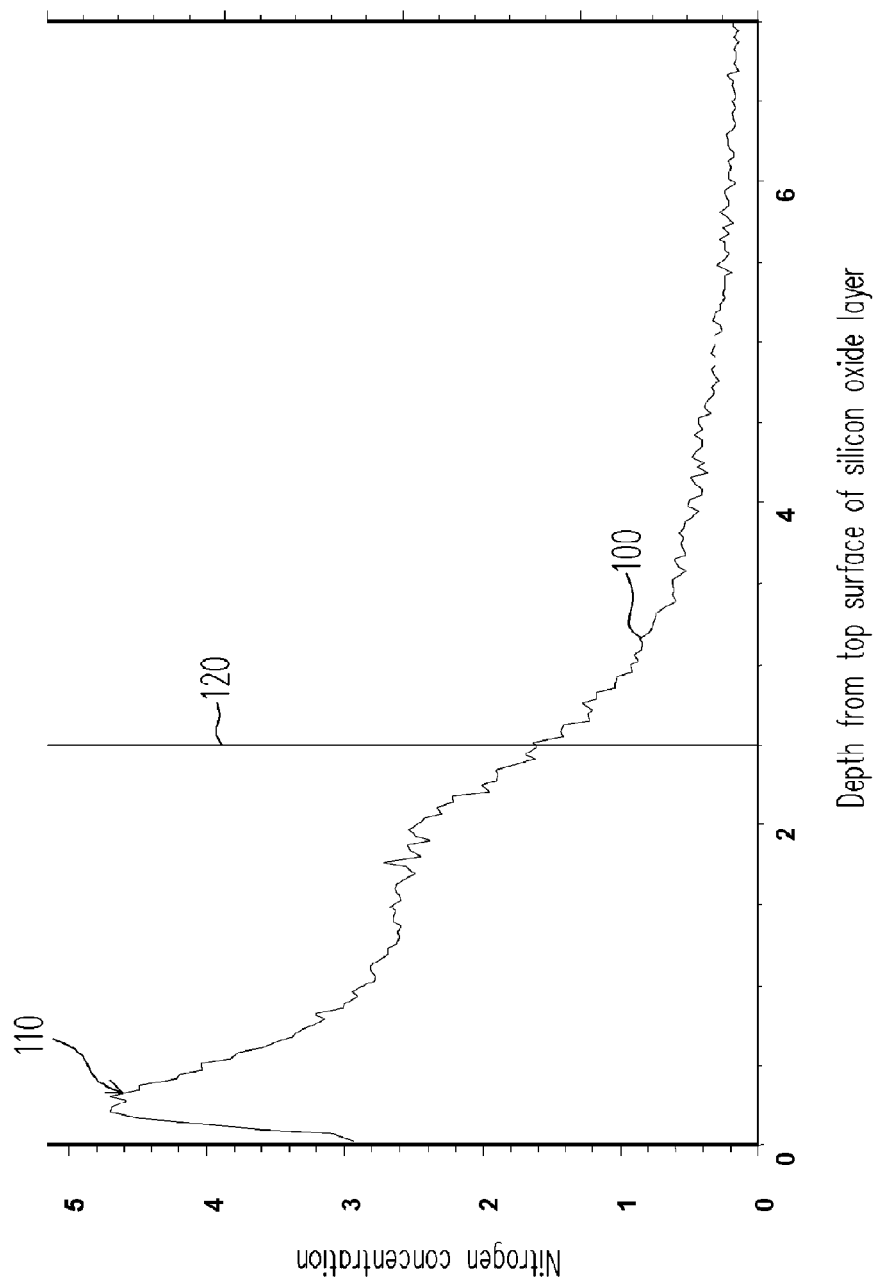
FIG. 1 is a graph showing the nitrogen distribution in a silicon oxide layer caused by a conventional nitrogen plasma treatment.

Reference will now be made in detail to the present embodiments of the invention, examples of which are illustrated in the accompanying drawings. Wherever possible, the same reference numbers are used in the drawings and the description to refer to the same or like parts.

Figure 2A:
FIGS. 2A through 2C are schematic cross-sectional views showing the steps for forming a gate dielectric layer according to one embodiment of the present invention.
Figure 2B:
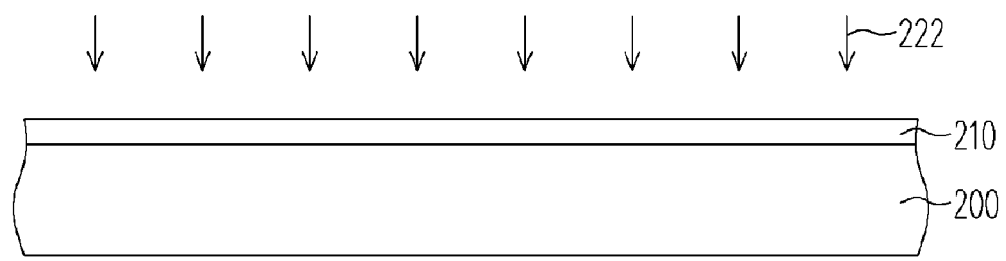
Figure 2C:
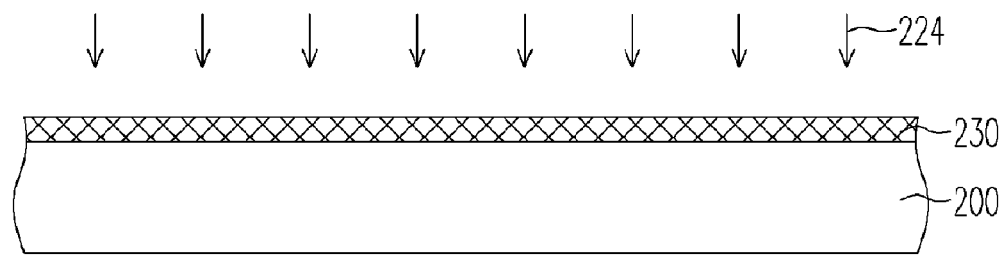

FIGS. 2A through 2C are schematic cross-sectional views showing the steps for forming a gate dielectric layer according to one embodiment of the present invention. As shown in FIG. 2A, a silicon oxide layer 210 is formed on a semiconductor substrate 200. The silicon oxide layer 210 is formed with, for example, thermal oxidation or chemical vapor deposition (CVD). Thereafter, as shown in FIGS. 2B and 2C, a first nitrogen doping process 222 and a second nitrogen doping process 224 are performed to the silicon oxide layer 210 using a plasma containing inert gas (for example, helium) and gaseous nitrogen to form a gate dielectric layer 230. In the embodiment of the present invention, the first nitrogen doping process 222 can be carried out before or after the second nitrogen doping process 224.

In the embodiment of the present invention, the first nitrogen doping process 222 is carried out at a lower power and a lower pressure than the second nitrogen doping process 224, but a higher inert gas/nitrogen gas ratio than the second nitrogen doping process 224. Specifically, when the inert gas is helium, the first nitrogen doping process 222 is carried out, for example, at a power of about 150–500 W, a pressure of about 5–20 mT, a helium/nitrogen ratio of about 0.5–0.9 for about 15–60 seconds. On the other hand, the second nitrogen doping process 224 is carried out, for example, at a power of about 800–1700 W, a pressure of about 50–80 mT, a helium/nitrogen ratio of at most 0.4 for about 30–300 seconds. The parameters for carrying out the first nitrogen doping process 222 and the second nitrogen doping process 224 are summarized in the following table.

| First nitrogen doping process | | | Second nitrogen doping process | | |
|---|---|---|---|---|---|
| Power (W) | Pressure (mT) | He/N$_2$ ratio | Power (W) | Pressure (mT) | He/N$_2$ ratio |
| 150–500 | 5–20 | 0.5–0.9 | 800–1700 | 50–80 | 0–0.4 |
| Low | Low | High | High | High | Low |

In the present invention, the pressure inside the reaction chamber determines how deep the nitrogen ions can enter the silicon oxide layer 210. When the pressure is low, the mean free path of nitrogen ions within the plasma is longer so that the nitrogen ions have higher kinetic energy to enter deeper into the oxide layer 230.

The inert gas/nitrogen gas ratio also determines how deep the nitrogen ions can enter the oxide layer 230. The inert gas can be helium, for example. When the inert gas/nitrogen gas ratio is higher, the ratio of nitrogen ions/nitrogen free radicals is higher according to the analysis of optical emission system (OES), while the nitrogen ions also have higher kinetic energy. Therefore, nitrogen dopants can penetrate deeper into the silicon oxide layer 210 when the inert gas/nitrogen gas ratio is higher.

Figure 3A:
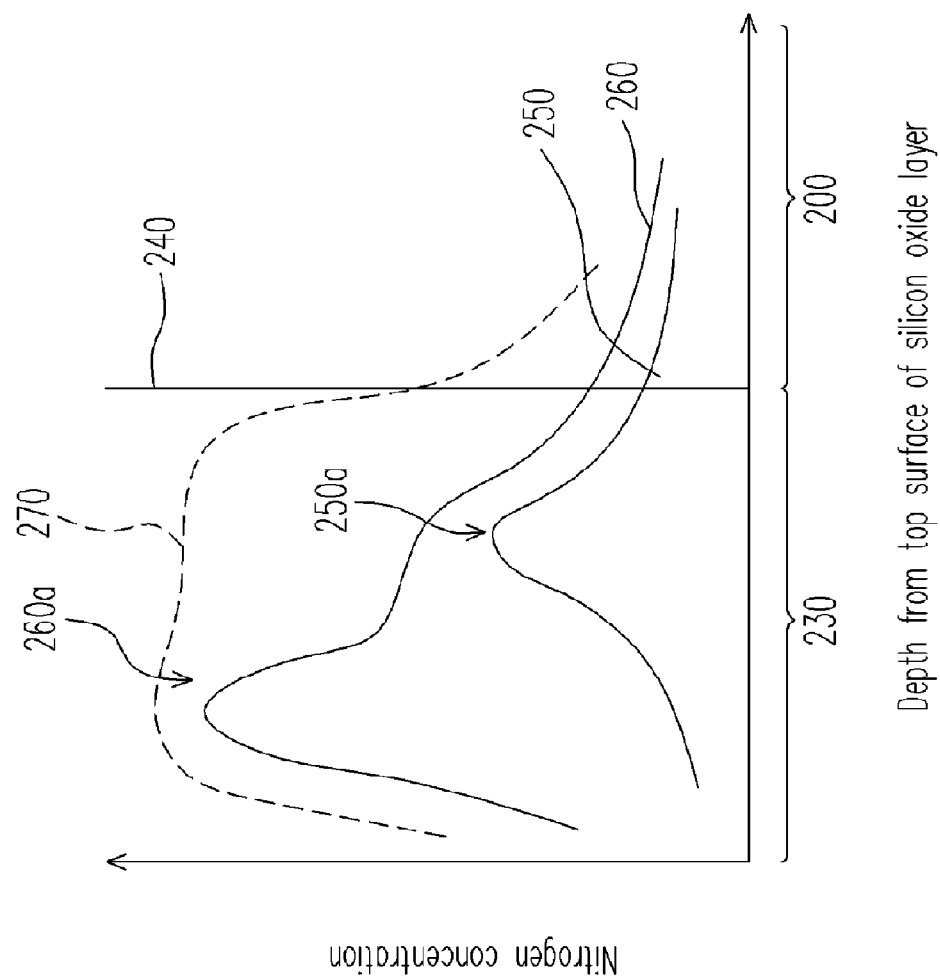
FIG. 3A is a schematic graph showing the nitrogen distribution profiles of the first and the second nitrogen doping processes and their combination according to one embodiment of the present invention.

FIG. 3A is a schematic graph showing the nitrogen concentration profiles of the first and the second nitrogen doping processes and their combination according to one embodiment of the present invention. In FIG. 3A, the interface between the gate dielectric layer 230 and the substrate 200 is labeled 240. In the embodiment of the present invention, the pressure for carrying out the first nitrogen doping process is set at a low value but the inert gas/nitrogen gas (He/N$_2$) ratio is set at a high value. Hence, the peak 250a of the nitrogen dopant distribution curve lies in the lower part of the oxide layer 230. On the other hand, the pressure for carrying out the first nitrogen doping process is set at a high value but the inert gas/nitrogen gas ratio is set at a low value. Therefore, the peak 260a of the nitrogen distribution curve lies in the upper part of the gate dielectric layer 230.

In addition, the plasma power and the doping duration can be used to control the doping dosage. When the plasma power is high, the decomposition rate of nitrogen molecules is also high. Hence, the nitrogen dosage for the same doping duration is higher; and, obviously, the dosage also increases when the doping duration is increased. As shown in FIG. 3, because the power is lower and the doping duration is shorter in the first nitrogen doping process, a doping profile 250 with a smaller peak is formed. On the other hand, the power is higher and the doping duration is longer in the second nitrogen doping process. Hence, a doping profile 260 with a higher peak is formed.

Figure 3B:
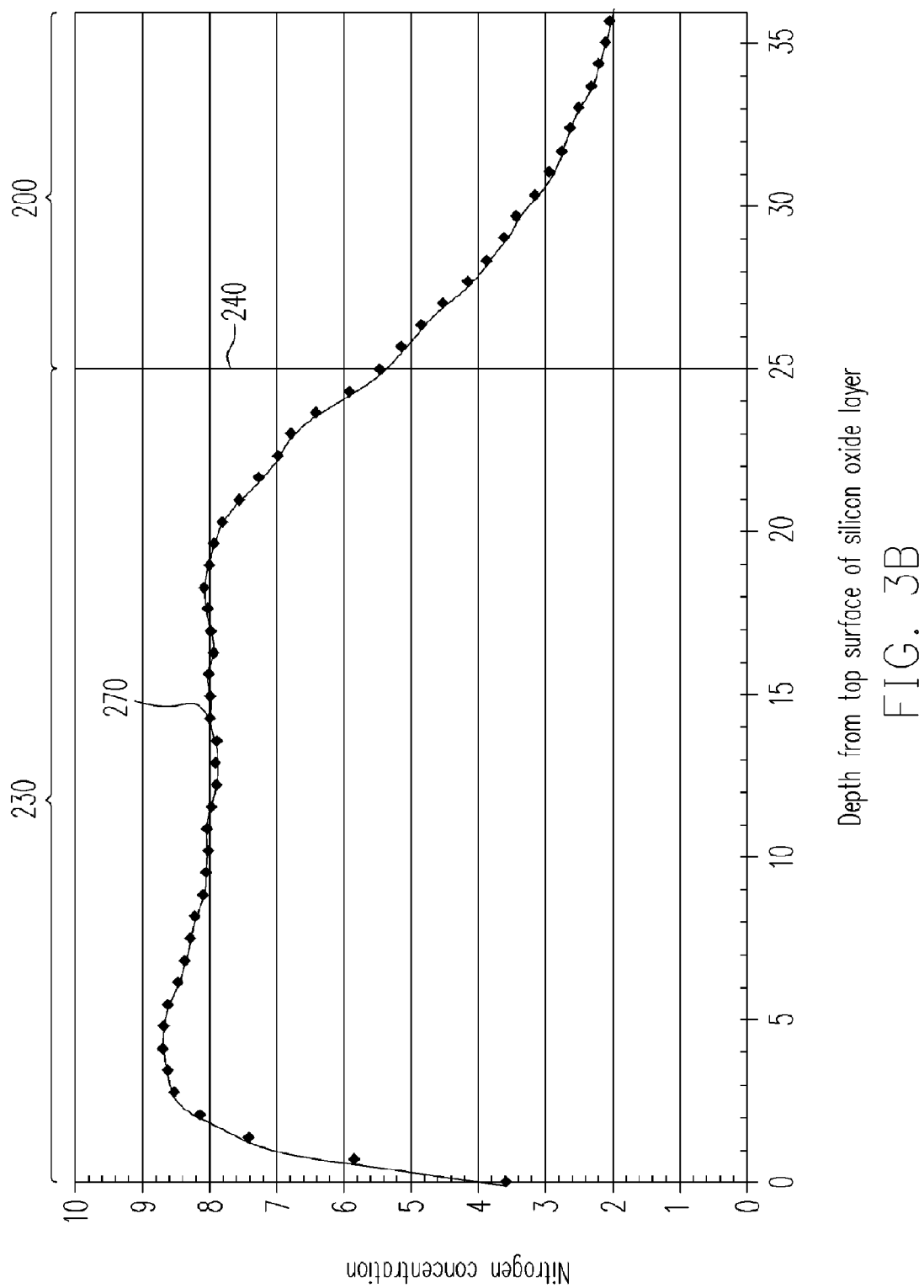
FIG. 3B is a graph showing the total nitrogen distribution inside a silicon oxide layer formed by the first and the second nitrogen doping processes in an example of the present invention.

FIG. 3B is a graph showing the total nitrogen distribution inside a silicon oxide layer formed by the first and the second nitrogen doping processes in an example of the present invention. As shown in FIG. 3B, the two-stage nitrogen doping process of the present invention is able to produce a flatter nitrogen distribution profile 270. In other words, the nitrogen dopants are substantially uniformly distributed from the top surface of the gate dielectric layer 230 to the interface 240 between the gate dielectric layer 230 and the substrate 200.

In summary, the method of forming the gate dielectric layer according to the present invention has at least the following advantages. The first nitrogen doping process produces a deep nitrogen distribution, while the second nitrogen doping process produces a shallow one. Therefore, the combined nitrogen distribution has a flatter profile throughout the gate dielectric layer. Moreover, the power level, doping period, pressure and inert gas/nitrogen gas ratio in the first and the second nitrogen doping process can be adjusted to control the implantation dosage and depth of nitrogen ions, so that a substantially flat nitrogen profiled can be obtained. Because of the flatter nitrogen profile from the surface of the gate dielectric layer to its interface with the substrate, leakage current from electron tunneling through the gate dielectric layer can be reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming a gate dielectric layer, comprising:
   forming a silicon oxide layer on a semiconductor substrate; and
   performing a first and a second nitrogen doping processes to the silicon oxide layer using a plasma containing inert gas and gaseous nitrogen to form a gate dielectric layer, wherein the first nitrogen doping process is performed at a lower power, a lower pressure but a higher inert gas/nitrogen gas ratio than those at the second nitrogen doping process.

2. The method of claim 1, wherein the inert gas comprises helium and the first nitrogen doping process is performed at a power of about 150–500W, a pressure of about 5–20 mT, a helium/nitrogen ratio of about 0.5–0.9 for about 15–60 seconds, while the second nitrogen doping process is performed at a power of about 800–1700W, a pressure of about 50–80 mT, a helium/nitrogen ratio of at most 0.4 for about 30–300 seconds.

3. The method of claim 1, wherein the first nitrogen doping process is performed before or after the second nitrogen doping process.

4. A method of forming a gate dielectric layer, comprising:
   forming a silicon oxide layer on a semiconductor substrate; and
   performing a first and a second nitrogen doping processes to the silicon oxide layer using a nitrogen-containing plasma, wherein a peak of a nitrogen distribution of the first nitrogen doping process lies in the lower part of the silicon oxide layer, while
   a peak of a nitrogen distribution of the second nitrogen doping process lies in the upper part of the silicon layer such that the combined nitrogen distribution within the silicon oxide layer is more uniform than the nitrogen distribution of the first or the second nitrogen doping process alone
   wherein the nitrogen-containing plasma is a plasma mixture comprising inert gas and gaseous nitrogen, and the first nitrogen doping process is performed at an inert gas/nitrogen gas ratio higher than that at the second nitrogen doping process and the inert gas/nitrogen gas ratio setting is able to produce the required nitrogen dopant distribution.

5. The method of claim 4, wherein the nitrogen distribution of the first nitrogen doping process together with the nitrogen distribution of the second nitrogen doping process form a substantially flat nitrogen profile in the silicon oxide layer.

6. The method of claim 4, wherein the first nitrogen doping process is performed at a pressure lower than that at the second nitrogen doping process and the pressure setting is able to produce the required nitrogen dopant distribution as described in claim 4.

7. The method or claim 4, wherein the inert gas comprises helium.

8. The method of claim 4, wherein the nitrogen-containing plasma is a plasma mixture comprising inert gas and gaseous nitrogen, and the method for obtaining the required nitrogen dopant distribution in the silicon oxide layer as described in claim 4 comprises:
   adjusting powers and doping periods of the first and the second nitrogen doping processes to control doping dosages or the first and the second nitrogen doping processes; and
   adjusting pressures and inert gas/nitrogen gas ratios of the first and the second nitrogen doping processes to control the doping depths of the first and the second nitrogen doping processes.

9. The method of claim 8, wherein the nitrogen distribution of the first nitrogen doping process together with the nitrogen distribution of the second nitrogen doping process form a substantially flat nitrogen profile in the silicon oxide layer.

* * * * *